(12) United States Patent
Chang et al.

(10) Patent No.: US 11,690,190 B2
(45) Date of Patent: Jun. 27, 2023

(54) SYSTEM COMPONENT CARRIER WITH EJECTOR

(71) Applicant: Quanta Computer Inc., Taoyuan (TW)

(72) Inventors: Chun Chang, Taoyuan (TW); Wei-Pin Chen, Taoyuan (TW); Kai-Yuan Chuang, Taoyuan (TW); Jyue Hou, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 225 days.

(21) Appl. No.: 17/239,874

(22) Filed: Apr. 26, 2021

(65) Prior Publication Data

US 2022/0346259 A1    Oct. 27, 2022

(51) Int. Cl.
| | | |
|---|---|---|
| *H05K 7/02* | (2006.01) | |
| *F04D 29/60* | (2006.01) | |
| *F04D 29/40* | (2006.01) | |
| *F04D 29/70* | (2006.01) | |
| *H05K 7/20* | (2006.01) | |

(52) U.S. Cl.
CPC ............. *H05K 7/02* (2013.01); *F04D 29/403* (2013.01); *F04D 29/601* (2013.01); *F04D 29/703* (2013.01); *H05K 7/20172* (2013.01); *H05K 7/20727* (2013.01)

(58) Field of Classification Search
CPC .......... H05K 7/20172; H05K 7/20727; H05K 7/20736; H05K 7/20136; H05K 7/1409; H05K 7/02; G06F 1/20; G06F 1/181; F04D 25/166; F04D 29/646; F04D 29/703; F04D 19/002; F04D 29/403; F04D 29/601
See application file for complete search history.

(56) References Cited

U.S. PATENT DOCUMENTS

| | | | | |
|---|---|---|---|---|
| 4,840,570 A * | 6/1989 | Mann, Jr. | ............. | H05K 7/1461 439/372 |
| 5,791,753 A * | 8/1998 | Paquin | .................... | G06F 1/181 312/223.1 |
| 5,906,497 A * | 5/1999 | Pham | ...................... | G06F 1/184 361/679.46 |
| 6,075,702 A * | 6/2000 | Gardner | ............... | H05K 7/1409 174/16.3 |
| 8,077,473 B1 * | 12/2011 | Lewis | .................. | H05K 7/1409 361/759 |
| 2003/0221291 A1 * | 12/2003 | Stewart | .................. | H05K 5/023 16/422 |

(Continued)

*Primary Examiner* — Michael A Matey
(74) *Attorney, Agent, or Firm* — Nixon Peabody LLP (57) ABSTRACT

A component carrier includes a baseboard, two sidewalls, and an ejector. The two sidewalls extend from opposite sides of the baseboard. The ejector includes a side plate, a handle, and a tab. The side plate is positioned in proximity to a first sidewall of the two sidewalls of the component carrier. The handle extends from a first end of the side plate in a first direction that is generally perpendicular to the side plate. The tab is positioned in proximity to the baseboard, and extends from a second opposing end of the side plate in a second direction that is generally perpendicular to the side plate and opposite to the first direction, the tab coupled to a first connector extending from the baseboard. The baseboard includes a first opening such that a portion of the tab of the ejector is configured to directly contact the electronic component therethrough.

20 Claims, 11 Drawing Sheets

(56) References Cited

U.S. PATENT DOCUMENTS

| | | | | |
|---|---|---|---|---|
| 2006/0279929 | A1* | 12/2006 | Chen | G06F 1/20 |
| | | | | 361/697 |
| 2006/0285292 | A1* | 12/2006 | Fan | H05K 7/20172 |
| | | | | 361/695 |
| 2007/0121290 | A1* | 5/2007 | Chou | G06F 1/20 |
| | | | | 361/695 |
| 2008/0019848 | A1* | 1/2008 | Chen | H05K 7/20727 |
| | | | | 417/360 |
| 2008/0025848 | A1* | 1/2008 | Wu | F04D 29/601 |
| | | | | 416/244 R |
| 2008/0253886 | A1* | 10/2008 | Chen | F04D 29/601 |
| | | | | 415/213.1 |
| 2009/0034191 | A1* | 2/2009 | Yin | H05K 7/20172 |
| | | | | 361/695 |
| 2009/0257192 | A1* | 10/2009 | Li | F04D 29/601 |
| | | | | 361/695 |
| 2010/0232976 | A1* | 9/2010 | Li | H05K 7/20172 |
| | | | | 416/244 R |
| 2013/0329371 | A1* | 12/2013 | Lee | G06F 1/20 |
| | | | | 361/724 |
| 2014/0369828 | A1* | 12/2014 | Wu | F04D 25/0613 |
| | | | | 415/213.1 |
| 2015/0070843 | A1* | 3/2015 | Mao | H05K 7/20727 |
| | | | | 361/695 |
| 2015/0085451 | A1* | 3/2015 | Yu | G06F 1/185 |
| | | | | 361/747 |
| 2019/0075667 | A1* | 3/2019 | Ehlen | H05K 5/03 |
| 2020/0068742 | A1* | 2/2020 | Tsorng | H05K 7/20736 |
| 2021/0201959 | A1* | 7/2021 | Tsorng | G06F 1/20 |
| 2022/0071052 | A1* | 3/2022 | Chang | H05K 7/20727 |
| 2022/0349225 | A1* | 11/2022 | Yeh | E05B 1/0046 |

* cited by examiner

SYSTEM COMPONENT CARRIER WITH EJECTOR

FIELD OF THE INVENTION

The present invention relates generally to component carriers within a computing or electronic system, and more particularly, to ejectors for aiding in removal of a component of a computing or electronic system.

BACKGROUND OF THE INVENTION

Computing systems (e.g., desktop computers, blade servers, rack-mount servers, etc.) are employed in large numbers in various applications. High-demand applications, such as in network-based systems, data centers, or in high-density finite element simulations, can require hardware of a computing system to operate at maximum capacity, causing excess heat to be generated during operation of the hardware of the computing systems. For example, a hard drive of a server, memory modules installed in the server, and processors of the server, etc., operating at high capacity can generate excess heat. Heat generated by individual components in the computing system is generally dissipated to avoid damage or performance degradation of such components in the computing system. Absent an efficient heat dissipation system, operation of hardware may be impeded by excess heat. For example, excessive heat can melt interconnects of fragile electronics or can damage substrates of these electronics.

Networked computer devices such as servers often include a chassis with high heat generation components such as power supply, processors, and memories. Additional functions may be added with a modular housing holding components such as hard disk drives (HDDs) to increase storage capacity. As server operation is critical, such modular housings are designed so they can be serviced without the server being taken offline or removed from the rack on which they are placed. For example, modular component housings such as fan modules for cooling the various components, are designed to be pulled out from the chassis while the processor and other components of the server continue to operate.

Figure 1:
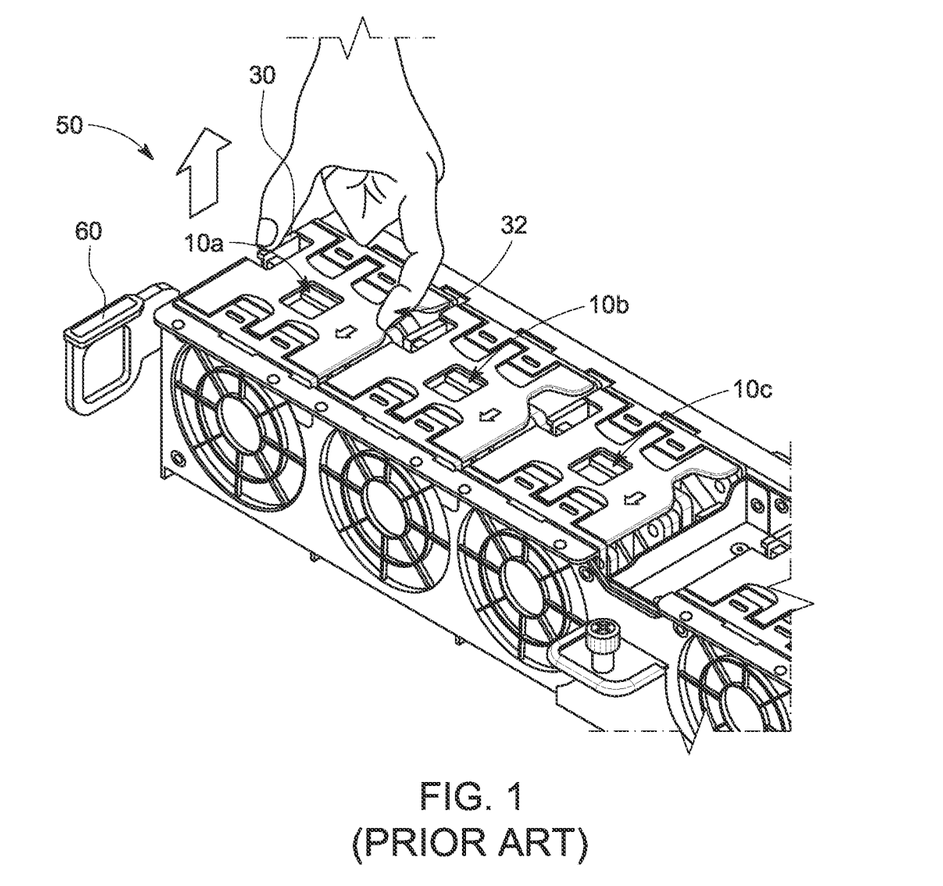
FIG. 1 is a perspective view showing a prior art fan carrier.

FIG. 1 shows a perspective view of a prior art fan carrier 50. The fan carrier 50 includes a row of fan modules, such as fan modules 10a, 10b, and 10c. Thus, the fan carrier 50 can be pulled out from a server chassis with the fan modules 10a, 10b, and 10c altogether (i.e., the entire wall of fan modules), for example, via a handgrip 60 affixed to the fan carrier 50. However, in some instances, only one fan module, such as the fan module 10a, may be required to be replaced or serviced.

The current method of replacing or servicing the fan module 10a is to first lift the fan module 10a out of the fan carrier 50. Due to limited operation space, the fan modules 10a, 10b, and 10c are positioned tightly adjacent to one another. As a result, there is little space for the user to grab the fan module 10a. Thus, a latch 30 and an opposing cutaway 32 are needed so that the user can pinch the latch 30 and the cutaway 32 to grab the fan module 10a. Nonetheless, it is still inconvenient for the user to rely on the latch 30 and the cutaway 32 when lifting the fan module 10a, as the center of gravity of the fan module 10a is much lower.

Figure 2:
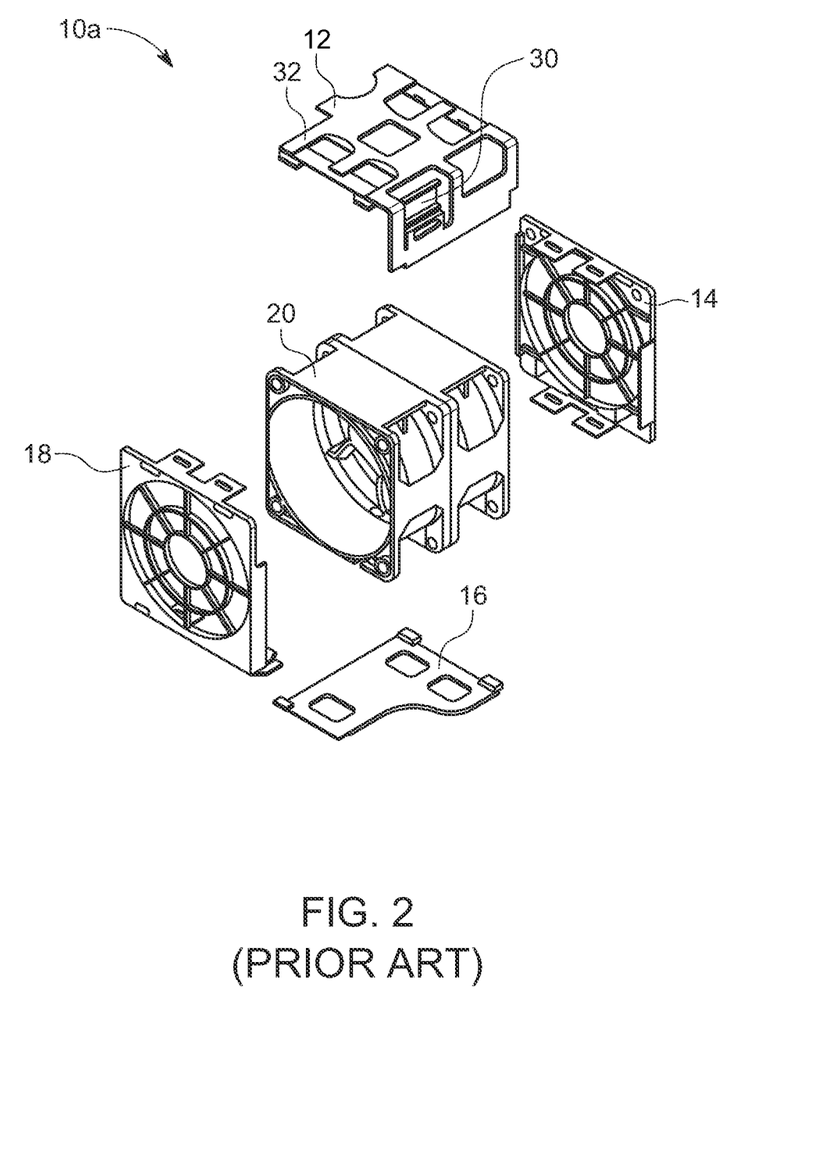
FIG. 2 is an exploded view showing a prior art fan module.

FIG. 2 shows an exploded view of the prior art fan module 10a. The fan module 10a includes a fan carrier 50 and a fan 20. The fan carrier includes four separate pieces: a top plate 12, two opposing fan guards 14 and 18, and a bottom plate 16. The top plate 12 includes the latch 30 and the cutaway 32. In order to assemble the fan module 10a together, the four pieces are necessary in order to enclose the fan 20 within the fan carrier 50, so that the fan module 10a can be lifted out of the fan carrier 50 (FIG. 1) during replacement or service.

However, due to advancement of technology, the number of pins required for connection between the fan connector and the motherboard has steadily increased. As a result, the force required for disconnecting the fan connector from the motherboard has increased. Thus, the user has to use more force to release and lift the fan module (e.g., the fan module 10a). Further, fan module replacement or service occurs frequently in a data center. It takes time to break down all the pieces (as shown in FIG. 2). Therefore, often times, the user discards the entire fan module 10a (which includes the top plate 12, the two opposing fan guards 14 and 18, and the bottom plate 16) when replacement is needed. Discarding the entire fan module 10a increases unnecessary costs.

Accordingly, a need exists for a component carrier that offers convenient and cost-effective removal of the enclosed component. The present disclosure is directed to solving these problems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a component carrier configured to house an electronic component is disclosed as follows. The component carrier includes a baseboard, two sidewalls, and an ejector. The baseboard is configured to interface the electronic component. The two sidewalls extend from opposite sides of the baseboard. The baseboard and the two sidewalls form a slot for receiving the electronic component. The ejector includes a side plate, a handle, and a tab. The side plate is positioned in proximity to a first sidewall of the two sidewalls of the component carrier. The handle extends from a first end of the side plate of the ejector in a first direction that is generally perpendicular to the side plate. The tab is positioned in proximity to the baseboard. The tab extends from a second end of the side plate that is opposite to the first end. The tab extends in a second direction that is (i) generally perpendicular to the side plate and (ii) opposite to the first direction, the tab coupled to a first connector extending from the baseboard. The baseboard includes a first opening such that a portion of the tab of the ejector is configured to directly contact the electronic component through the first opening.

In some implementations, the tab of the ejector includes a raised protrusion that is configured to directly contact the electronic component. In some such implementations, the raised protrusion is configured to directly contact the electronic component at a location adjacent to an external connector of the electronic component.

In some implementations, the tab is pivotably coupled to the first connector, which extends from the baseboard adjacent to the first sidewall of the component carrier. In some such implementations, the side plate of the ejector is integrated with the handle and the tab of the ejector, such that pulling the handle away from the first sidewall of the component carrier causes the tab to advance inside the slot through the first opening of the baseboard. In some other such implementations, the side plate of the ejector is integrated with the handle, and rotatably coupled to the tab of the ejector, such that pushing the handle towards the baseboard of the component carrier causes the tab to advance inside the slot through the first opening of the baseboard.

In some implementations, the electronic component is a fan module. In some such implementations, each of the two sidewalls of the component carrier includes a generally circular opening in a path of airflow generated by the fan module. In some implementations, the fan module includes a fan and a fan holder. In some implementations, the fan holder includes two opposing fan guards. The fan holder is configured to receive the fan such that the two opposing fan guards are disposed on two opposing sides of the fan and in a path of airflow generated by the fan. In some implementations, the side plate of the ejector includes a generally circular opening in the path of airflow generated by the fan. In some implementations, the fan holder further includes a bottom plate integrated with the two opposing fan guards.

According to certain aspects of the present disclosure, a component carrier includes a baseboard, a first sidewall, a second sidewall, and an ejector. The baseboard is configured to interface a component module. The first sidewall and the second sidewall extend from opposite sides of the baseboard. The baseboard, the first sidewall, and the second sidewall form a slot for receiving the component module. The ejector includes a generally rectangular side plate, a handle, and a tab. The handle extends from a first end of the side plate of the ejector in a first direction that is generally perpendicular to the side plate. The tab is positioned in proximity to the baseboard. The tab extends from a second end of the side plate that is opposite to the first end. The tab extends in a second direction that is (i) generally perpendicular to the side plate and (ii) opposite to the first direction. The tab is coupled to a first connector extending from the baseboard. The component module includes an external connector for coupling the component module to an electronic component outside the component carrier. The component carrier is configured to receive the component module such that the external connector of the component module is closer to the first sidewall than the second sidewall. The baseboard includes an opening such that a portion of the tab of the ejector is configured to directly contact the component module through the opening.

In some implementations, the side plate of the ejector is positioned in proximity to the first sidewall. The tab is pivotably coupled to the first connector, which extends from the baseboard adjacent to the first sidewall of the component carrier. In some such implementations, the side plate of the ejector is integrated with the handle and the tab of the ejector, such that pulling the handle away from the first sidewall causes the tab to advance inside the slot through the opening of the baseboard.

In some implementations, the side plate of the ejector is positioned in proximity to the second sidewall. The tab is pivotably coupled to the first connector, which extends from the baseboard adjacent to the second sidewall of the component carrier. In some such implementations, the side plate of the ejector is integrated with the handle and rotatably coupled to the tab of the ejector, such that pushing the handle towards the baseboard of the component carrier causes the tab to advance inside the slot through the opening of the baseboard. In some other such implementations, the side plate of the ejector is integrated with the handle and the tab of the ejector, such that pulling the handle away from the second sidewall causes the tab to advance inside the slot through the opening of the baseboard.

According to certain aspects of the present disclosure, an ejector for coupling to a component carrier is disclosed as follows. The ejector includes a generally rectangular side plate, a handle, and a tab. The side plate is positioned in proximity to a first sidewall of two sidewalls of the component carrier. The component carrier includes a baseboard and two sidewalls. The baseboard of the component carrier is configured to interface an electronic component. The two sidewalls of the component carrier extend from opposite sides of the baseboard, such that the baseboard and the two sidewalls form a slot for receiving the electronic component. The handle extends from a first end of the side plate of the ejector in a first direction that is generally perpendicular to the side plate. The tab is positioned in proximity to the baseboard. The tab extends from a second end of the side plate that is opposite to the first end. The tab extends in a second direction that is (i) generally perpendicular to the side plate and (ii) opposite to the first direction. The tab is coupled to a first connector, which extends from the baseboard of the component carrier. The baseboard of the component carrier includes an opening such that a portion of the tab of the ejector is configured to directly contact the electronic component through the opening.

In some implementations, the tab is pivotably coupled to the first connector, which extends from the baseboard adjacent to the first sidewall of the component carrier, such that actuation of the handle causes the tab to advance inside the slot through the opening of the baseboard of the component carrier.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

The present disclosure relates to a system component carrier with an ejector, which is configured to house an electronic component. Actuation of the ejector causes a tab of the ejector to push the electronic component upwards relative to the system component carrier.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 3:
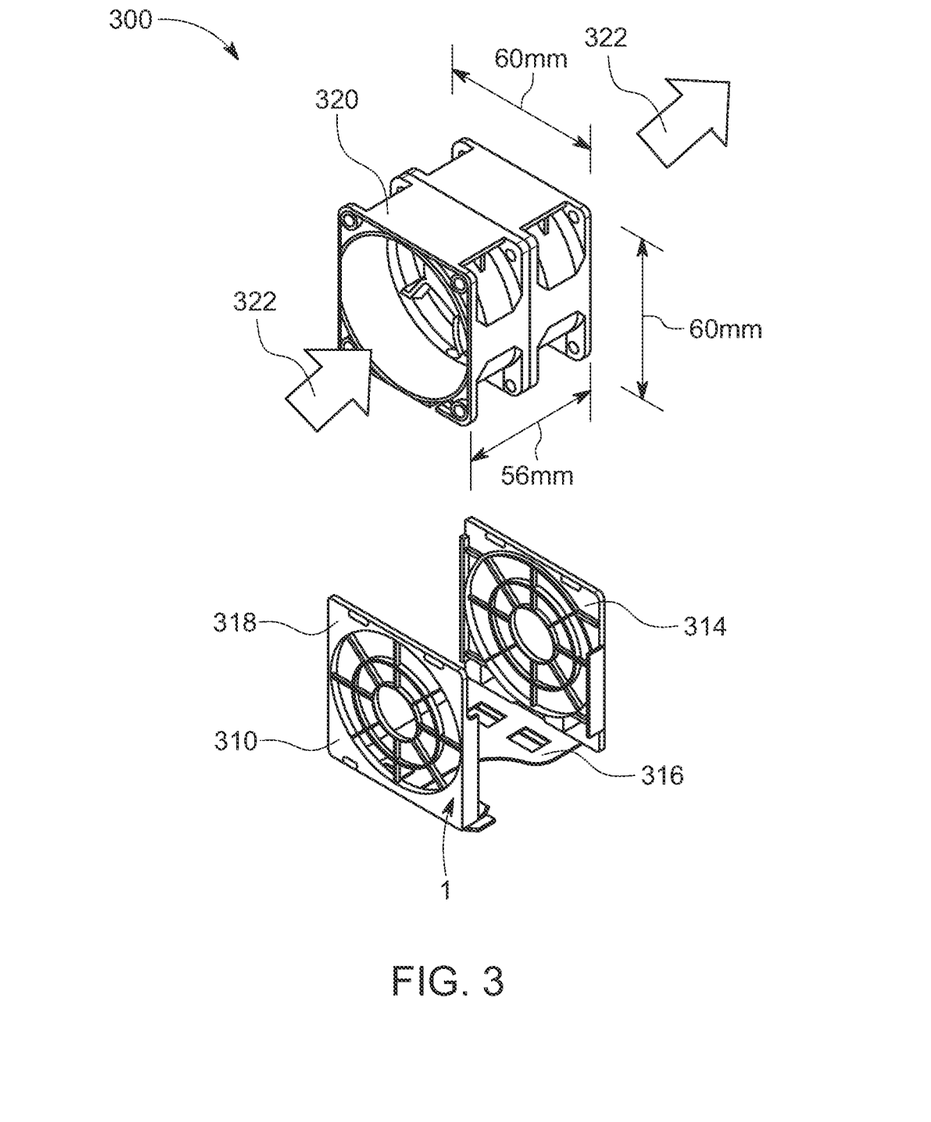
FIG. 3 is an exploded view showing a fan module, according to certain aspects of the present disclosure.

Referring to FIG. 3, an exploded view of a fan module 300 is shown, according to certain aspects of the present disclosure. The fan module 300 includes a fan holder 310 and a fan 320. The fan 320 can include a motor that causes a plurality of fan blades to rotate, thereby causing an airflow 322. The fan holder 310 includes a bottom plate 316, and two opposing fan guards 314 and 318. The fan holder 310 is configured to receive the fan 320 such that the two opposing fan guards 314 and 318 are disposed on two opposing sides of the fan 320, and in a path of the airflow 322 generated by the fan 320. The fan guards 314 and 318 of the fan holder 310 can protect a user from accidentally contacting the fan blades of the fan 320. The bottom plate 316 is configured to fix an external connector 520 (FIG. 5) to the fan 320, so that the fan 320 can be coupled to a motherboard of an electronic system.

In some implementations, the bottom plate 316 is integrated with the two opposing fan guards 314 and 318. As described in more detail herein, as compared to the prior art fan module 10a, the fan module 300 of the present disclosure does not require a top plate, such as the top plate 12 (FIG. 2). For example, the fan module 300 may be housed in a fan carrier 400 (FIG. 4) and/or a fan carrier 800 (FIG. 8), each of which includes an ejector that is configured to advance the fan module 300 out of the fan carrier 400 or the fan carrier 800.

Figure 4:
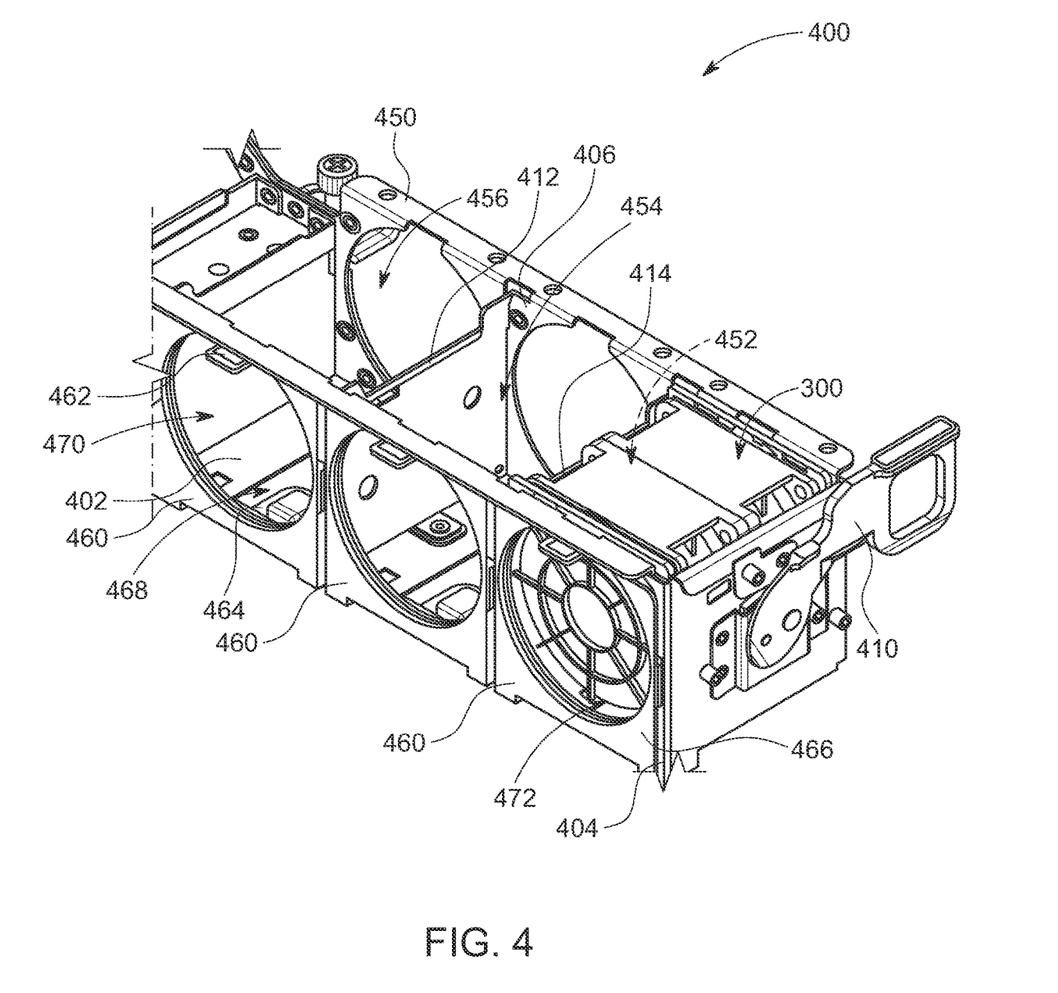
FIG. 4 is a perspective view showing a fan carrier having a first type of ejectors, according to certain aspects of the present disclosure.

Referring to FIG. 4, a perspective view of the fan carrier 400 having a first type of ejectors 460 is shown, according to certain aspects of the present disclosure. The fan carrier 400 is configured to house a fan module, such as the fan module 300. The fan carrier 400 includes a carrier housing 450, three ejectors 460, and a handgrip 410. In some implementations, the handgrip 410 can be used to secure the fan carrier 400 in a chassis. For example, when the handgrip is rotated counterclockwise from the position shown in FIG. 4, the entire fan carrier 400 is unlocked and can be removed from the chassis. The carrier housing 450 includes a baseboard 402, a first sidewall 404, a second sidewall 406. The baseboard 402 of the carrier housing 450 is configured to interface the fan module 300 by holding it in place.

The first sidewall 404 and the second sidewall 406 of the carrier housing 450 extend from opposite sides of the baseboard 402, such that the baseboard 402, the first sidewall 404, and the second sidewall 406 form a slot for receiving the fan module 300. In this example, two dividers 412 and 414 further separate the carrier housing 450 into having three slots 452, 454, and 456. Each of the slots 452, 454, and 456 is configured to receive one fan module, such as the fan module 300.

In some implementations, the first sidewall 404 and the second sidewall 406 of the carrier housing 450, for each of the slots 452, 454, and 456, includes a generally circular opening 470 in a path of airflow generated by the fan module 300. The first sidewall 404 and the second sidewall 406 are configured to be adjacent to the two opposing fan guards 314 and 318 of the fan module 300 shown in FIG. 3, respectively.

Each ejector 460 includes a generally rectangular side plate 466, a handle 462, and a tab 464. The side plate 466 of the ejector 460 is positioned in proximity to and/or adjacent the first sidewall 404 of the carrier housing 450. The handle 462 of the ejector 460 extends from a first end of the side plate 466 of the ejector 460, in a first direction that is generally perpendicular to the side plate 466. In some implementations, the side plate 466 includes a generally circular opening 472 in the path of airflow generated by the fan module 300, mimicking the opening 470.

The tab 464 of the ejector 460 is positioned in proximity to and/or adjacent the baseboard 402 of the fan carrier 400. The tab 464 extends from a second opposing end of the side plate 466 of the ejector 460 in a second direction. The second direction is (i) generally perpendicular to the side plate 466 and (ii) opposite to the first direction described above. In some implementations, for each of the slots 452, 454, and 456, the baseboard 402 of the carrier housing 450 includes an opening 468, such that a portion of the tab 464 of the ejector 460 is configured to directly contact the fan module 300 through the opening 468.

Figure 5:
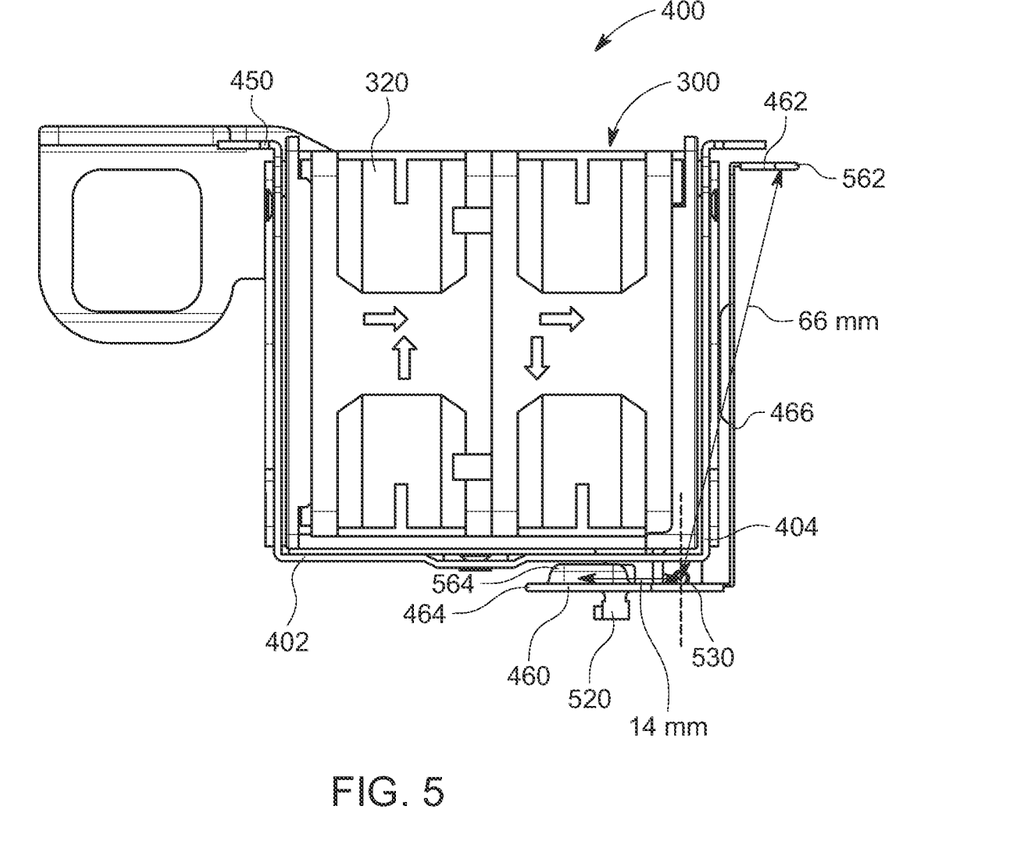
FIG. 5 is a side view showing a fan module housed in the fan carrier of FIG. 4, according to certain aspects of the present disclosure.

Referring to FIG. 5, the fan module 300 is housed within the carrier housing 450 of the fan carrier 400. The ejector 460 is coupled to the carrier housing 450 via the tab 464 of the ejector 460. More specifically, the tab 464 is pivotably coupled to a carrier connector 530 (e.g., via a pin), which extends from the baseboard 402 of the carrier housing 450. In this example, the carrier connector 530 is positioned adjacent to the first sidewall 404 of the carrier housing 450.

In some implementations, the tab 464 of the ejector 460 includes a raised protrusion 564 that is configured to directly contact the fan module 300. In some implementations, the raised protrusion 564 is configured to directly contact the fan module 300, adjacent to the external connector 520 of the fan module 300. The external connector 520 is configured to couple the fan 320 to a motherboard (or PCBA) that is external to the fan module 300. Positioning the raised protrusion 564 in proximity to and/or adjacent the external connector 520 aids in disconnecting the external connector 520 from the motherboard. For example, in some implementations, the external connector 520 includes a plurality of pins for connection between the fan 320 and the motherboard, which requires force to disconnect. Based on the law of the lever, a user can actuate the ejector 460 (e.g., by pulling the handle 462), and the fan module 300 will automatically disconnect from the connector 520 (e.g., connected to the motherboard) due to the transferred force.

In this example, the fan 320 is dimensioned as 60 mm×60 mm×56 mm (FIG. 3). Thus, for this example, a first distance between a distal end 562 of the handle 462 and the carrier connector 530 is about 66 mm, and a second distance between the carrier connector 530 and a center of the raised protrusion 564 is about 14 mm. The distances of 66 mm and 14 mm are leveraged to provide mechanical advantage (e.g., to save force ratio). However, the relative dimensions of the components of the fan carrier 400 can be adjusted accordingly with the same or similar ratios to the fan 320, if different fans are used.

Figure 6:
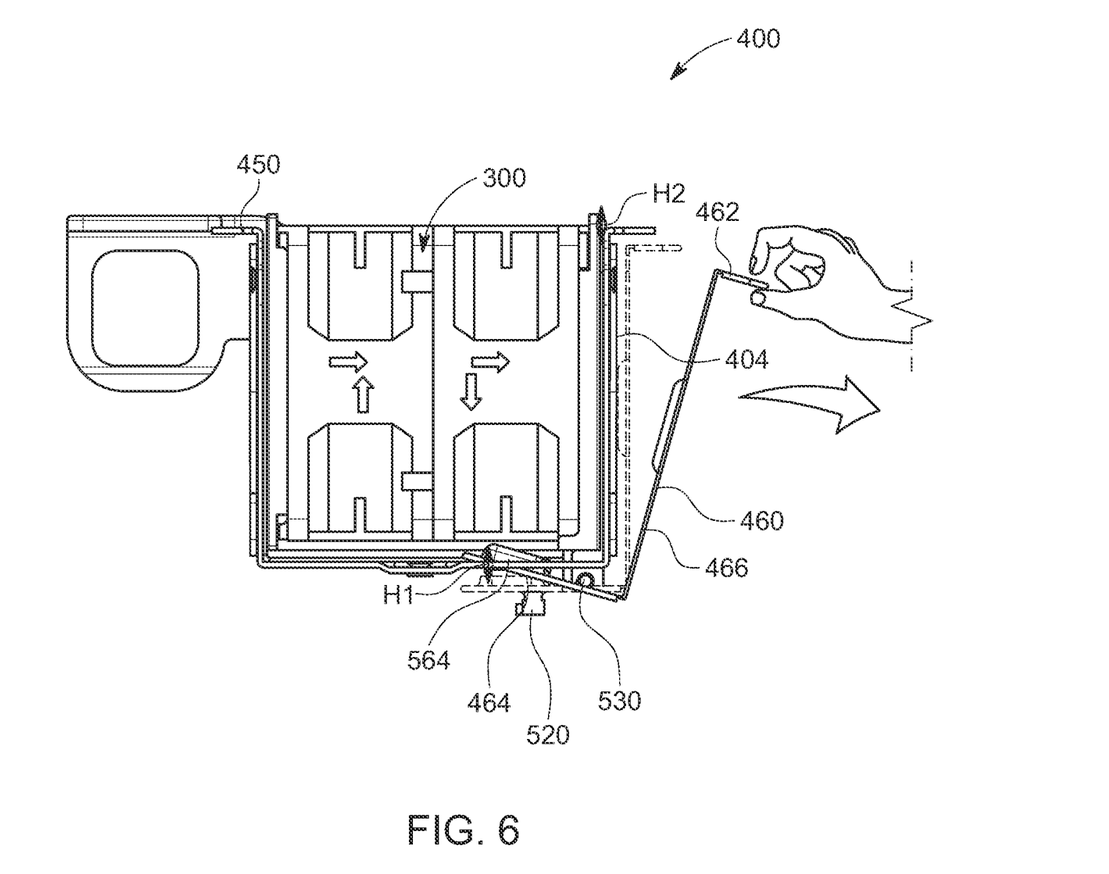
FIG. 6 is a side view showing the displacement of the fan module from the fan carrier of FIG. 4, according to certain aspects of the present disclosure.

Referring to FIG. 6 in view of FIG. 5, in some implementations, the side plate 466 of the ejector 460 is integrated with the handle 462 and the tab 464, such that pulling the handle 462 away from the first sidewall 404 of the carrier housing 450 causes the raised protrusion 564 of the tab 464 to advance inside the slot 452 (FIG. 4) through a corresponding opening (not shown) of the baseboard 402. As shown in FIG. 6, after the handle 462 is pulled away from the first sidewall 404 of the carrier housing 450, the raised protrusion 564 of the tab 464 is advanced upwards by a first height H1. Accordingly, the fan module 300 is advanced out of the carrier housing 450 by a second height of H2, which is the same as the height H1 in this example.

Figure 7:
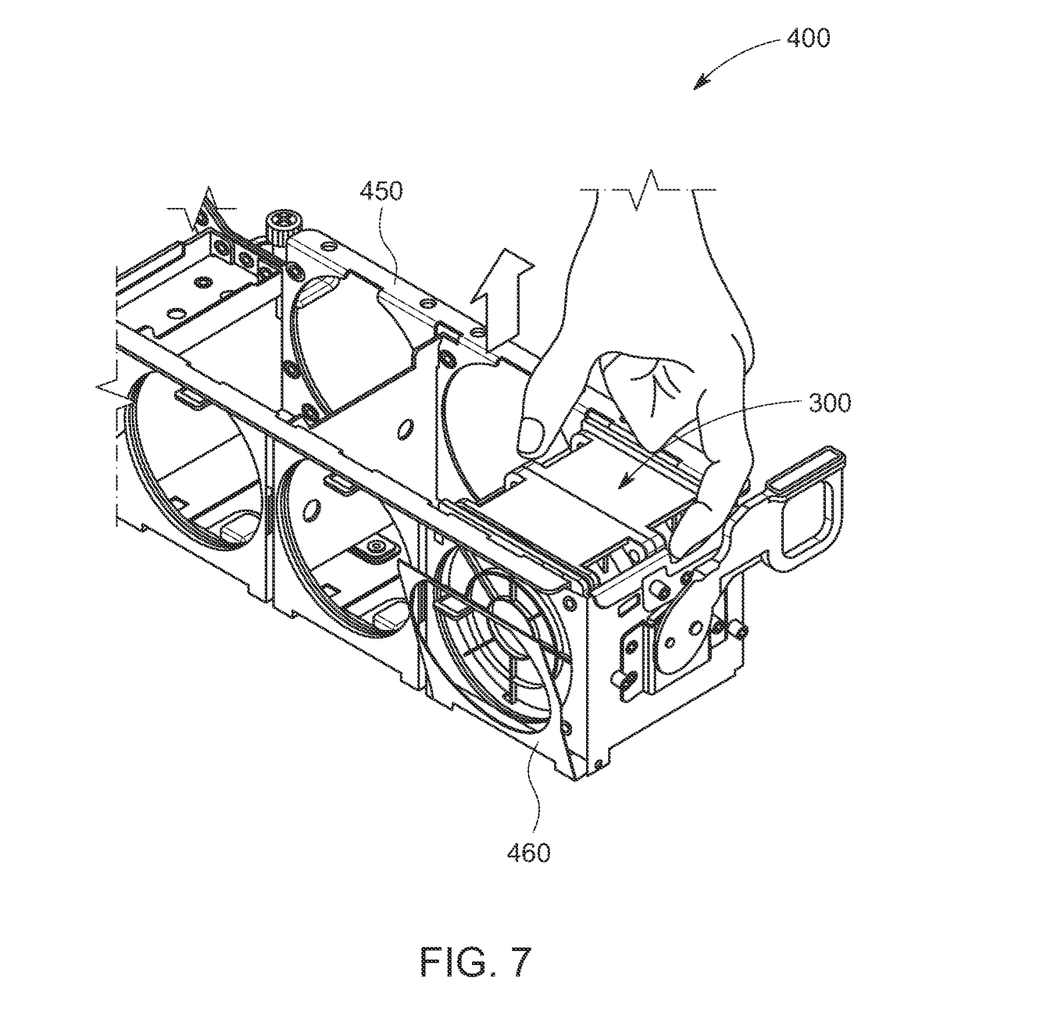
FIG. 7 is a perspective view showing the removal of the fan module from the fan carrier of FIG. 4, according to certain aspects of the present disclosure.

Referring to FIG. 7, a perspective view illustrating the removal of the fan module 300 from the fan carrier 400 is shown, according to certain aspects of the present disclosure. After a user actuates the ejector 460, the fan module 300 is advanced out of the carrier housing 450, and the fan module 300 can be removed by the user by grabbing onto the fan module 300 itself.

Figure 8:
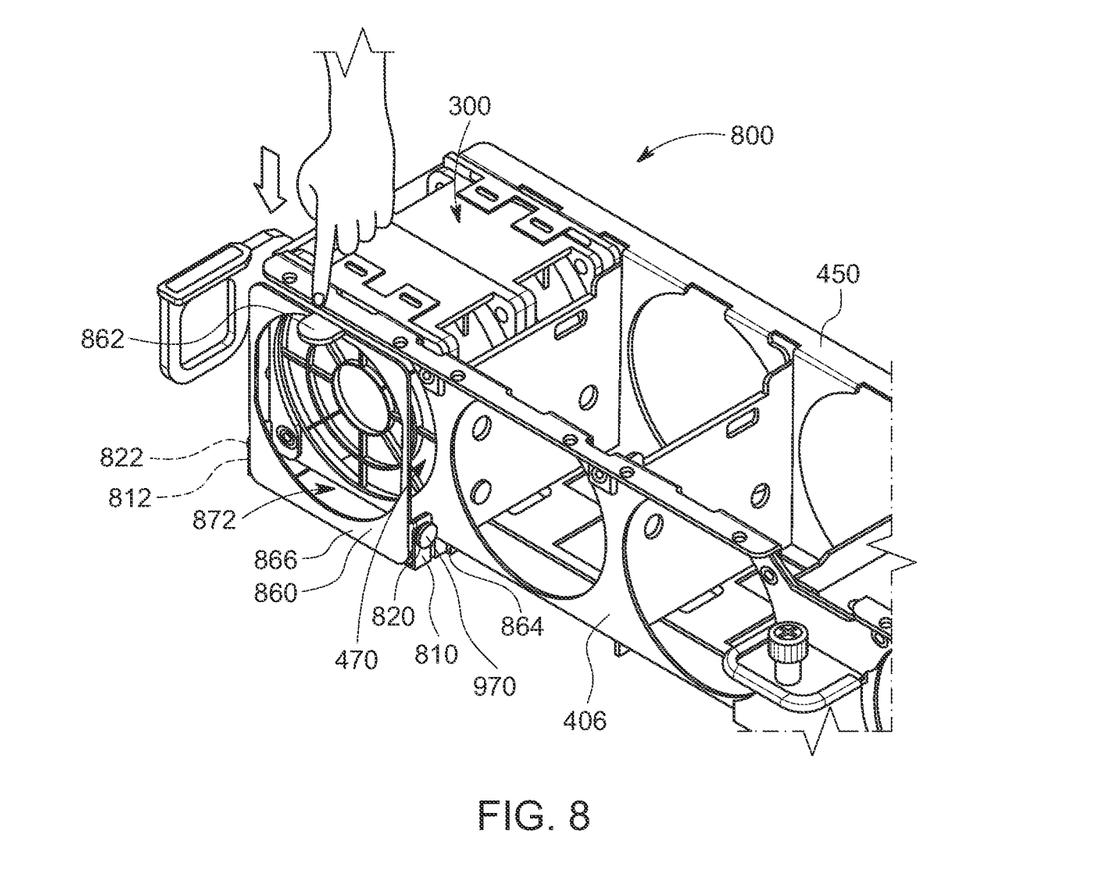
FIG. 8 is a perspective view showing a fan carrier having a second type of ejector, according to certain aspects of the present disclosure.

Referring to FIG. 8, a perspective view of the fan carrier 800 having a second type of ejector 860 is shown, according to certain aspects of the present disclosure. The fan carrier 800 is configured to house a fan module, such as the fan module 300. The fan carrier 800 includes a carrier housing, which is the same as, or similar to the carrier housing 450 of the fan carrier 400 (FIG. 4), where identical reference numerals refer to identical elements. The fan carrier 800 also includes the ejector 860.

The ejector 860 includes a generally rectangular side plate 866, a handle 862, and a tab 864. The side plate 866 of the ejector 860 is positioned in proximity to and/or adjacent the second sidewall 406 of the carrier housing 450. The handle 862 of the ejector 860 extends from a first end of the side plate 866 of the ejector 860, in a first direction that is generally perpendicular to the side plate 866. In some implementations, the side plate 866 of the ejector 860 is integrated with the handle 862.

The tab 864 of the ejector extends from a second opposing end of the side plate 866 of the ejector 860 in a second direction. The second direction is (i) generally perpendicular to the side plate 866 and (ii) opposite to the first direction described above. In some implementations, the tab 864 includes two flanges 810 and 812 rotatably coupled to two corresponding flanges 820 and 822 respectively of the side plate 866. For example, the flange 810 of the tab 864 is rotatably coupled to the corresponding flange 820 of the side plate 866 via a hinge 970. In some implementations, the side plate 866 includes a generally circular opening 872 in the path of airflow generated by the fan module 300, mimicking the opening 470 in the second sidewall 406 of the carrier housing 450.

Figure 9:
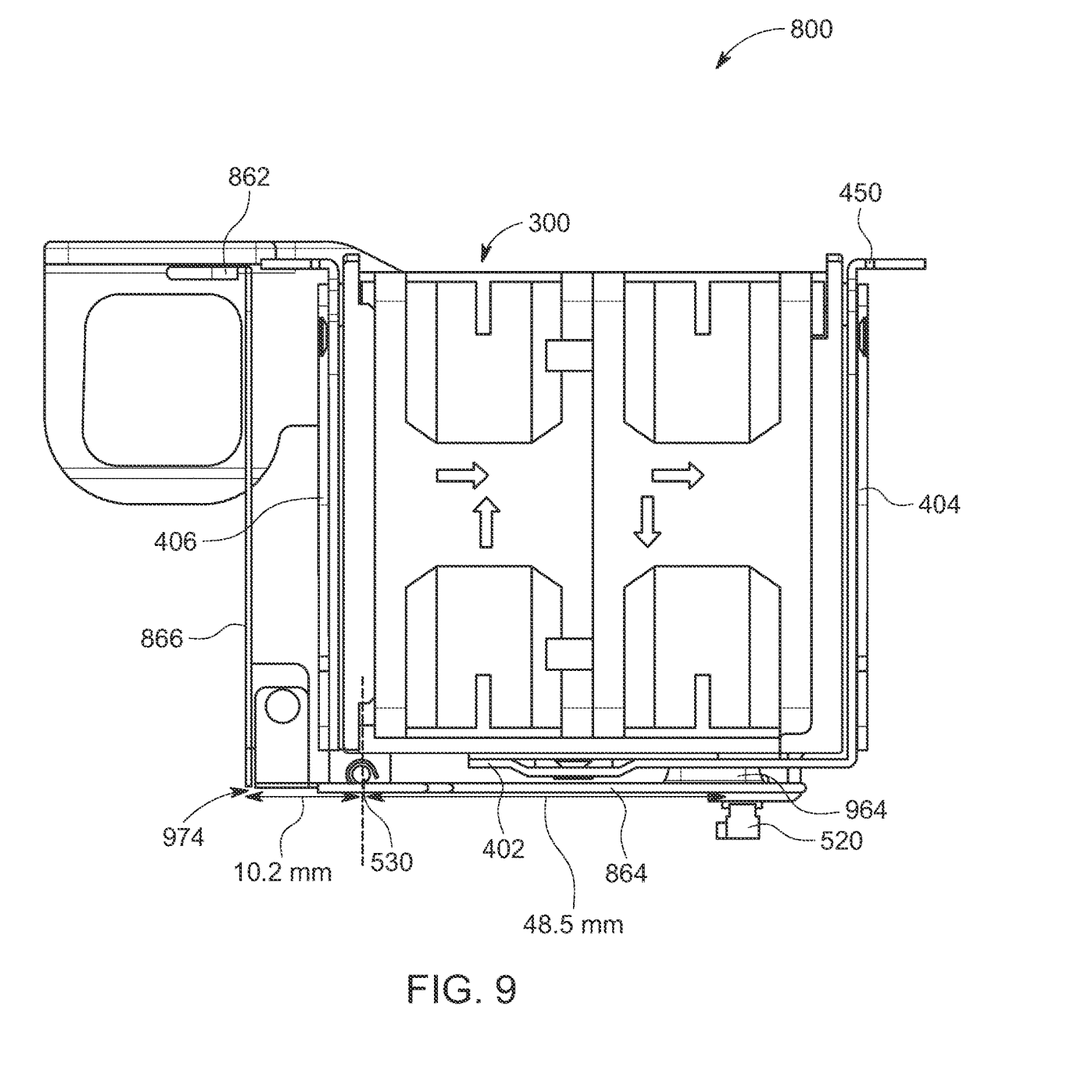
FIG. 9 is a side view showing a fan module housed in the fan carrier of FIG. 8, according to certain aspects of the present disclosure.

Referring to FIG. 9, the fan module 300 is housed within the carrier housing 450 of the fan carrier 800. The ejector 860 is coupled to the carrier housing 450 via the tab 864 of the ejector 860. More specifically, the tab 864 is pivotably coupled to a carrier connector, which is the same, or similar to, the carrier connector 530 shown in FIG. 5. In this example, the carrier connector 530 extends from the baseboard 402 of the carrier housing 450, and is positioned adjacent to the second sidewall 406 of the carrier housing 450.

In some implementations, the tab 864 of the ejector 860 includes a raised protrusion 964 that is configured to directly contact the fan module 300. In some implementations, the raised protrusion 964 is configured to directly contact the fan module 300, adjacent to the external connector 520 of the fan module 300. In this example, the external connector 520 is positioned in proximity to and/or adjacent the first sidewall 404 of the carrier housing 450.

In this example, the fan 320 is dimensioned as 60 mm×60 mm×56 mm (FIG. 3). Thus, for this example, a first distance between a proximal end of the tab 974 and the carrier connector 530 is about 10.2 mm, and a second distance between the carrier connector 530 and a center of the raised protrusion 564 is about 48.5 mm. The distances of 10.2 mm and 48.5 mm are leveraged to provide mechanical advantage (e.g., to save force ratio). However, the relative dimensions of the components of the fan carrier 800 can be adjusted accordingly with the same or similar ratios to the fan 320, if different fans are used.

Figure 10:
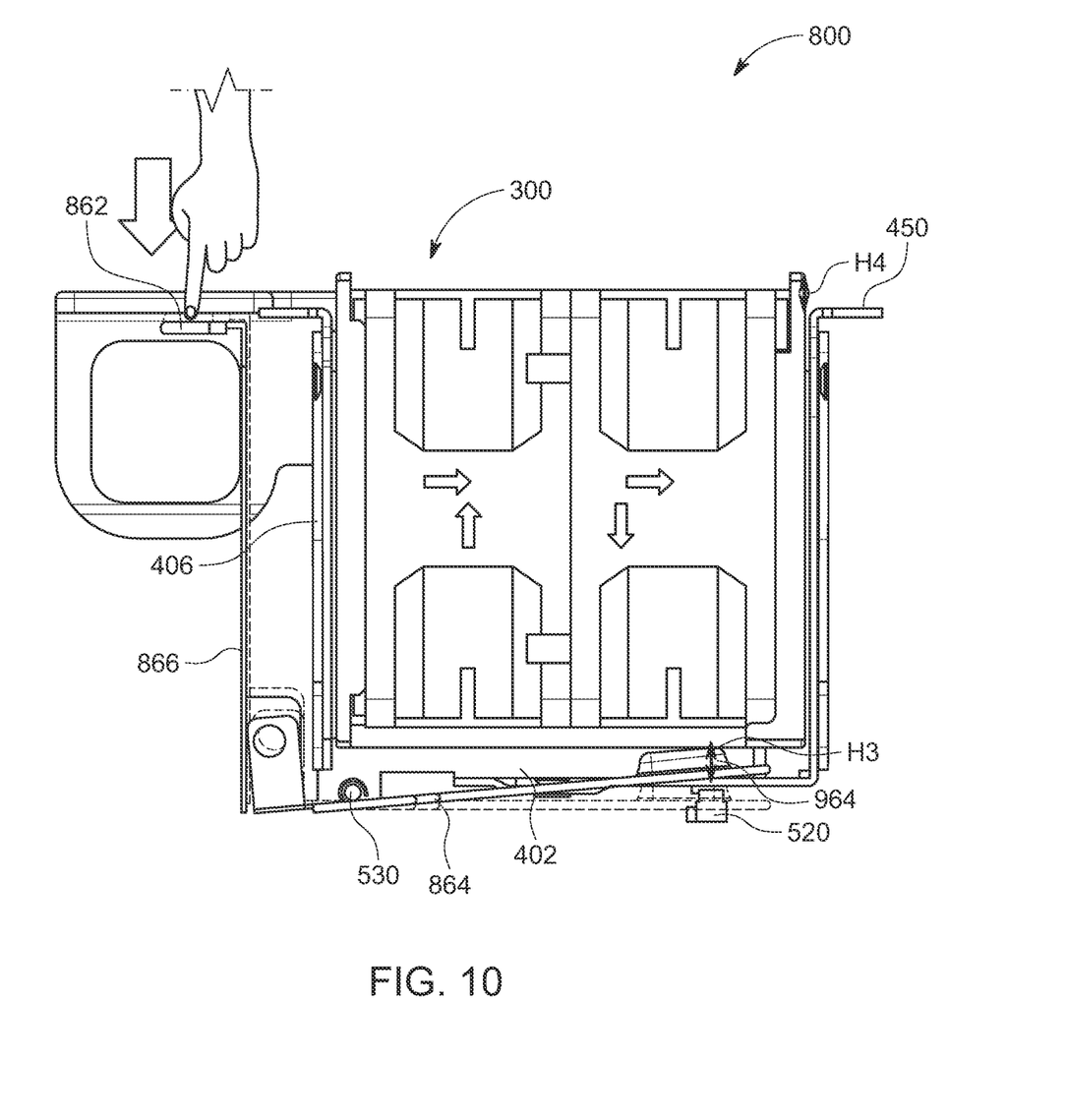
FIG. 10 is a side view showing the displacement of the fan module from the fan carrier of FIG. 8, according to certain aspects of the present disclosure.

Referring to FIG. 10 in view of FIG. 9, pushing the handle 862 of the ejector 860 towards the baseboard 402 of the carrier housing 450 causes the tab 864 to pivot around the carrier connector 530, which in turn causes the raised protrusion 964 to advance inside the slot 452 (FIG. 4) through a corresponding opening (not shown) of the baseboard 402. As shown in FIG. 10, after the handle 862 is pushed along the second sidewall 406 of the carrier housing 450, the raised protrusion 964 of the tab 864 is advanced upwards by a third height H3. Accordingly, the fan module 300 is advanced out of the carrier housing 450 by a second height of H4, which is the same as the height H3 in this example.

Figure 11:
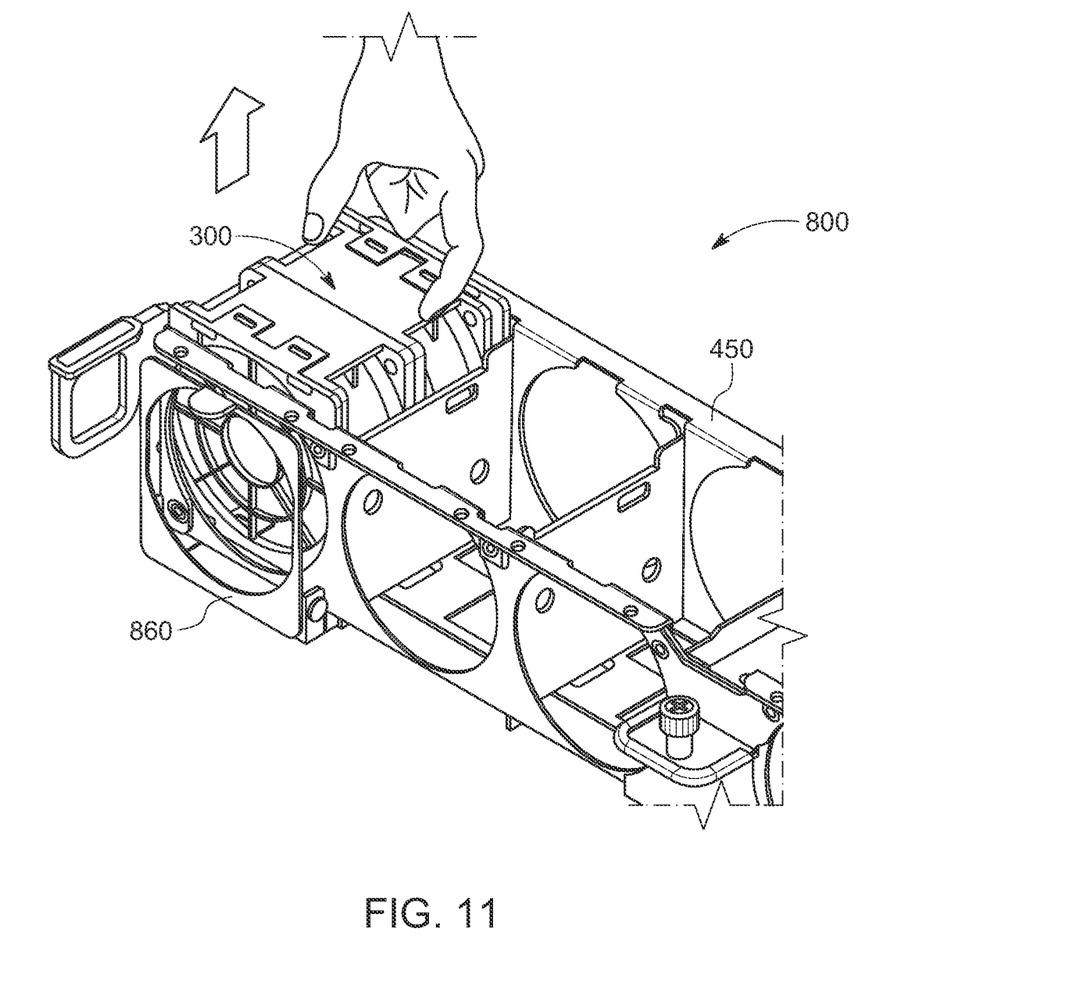
FIG. 11 is a perspective view showing the removal of the fan module from the fan carrier of FIG. 8, according to certain aspects of the present disclosure.

Referring to FIG. 11, a perspective view illustrating the removal of the fan module 300 from the fan carrier 800 is shown, according to certain aspects of the present disclosure. After a user actuates the ejector 860, the fan module 300 is advanced out of the carrier housing 450, and the fan module 300 can be removed by the user by grabbing onto the fan module 300 itself.

The fan carriers 400 in FIGS. 4 and 800 in FIG. 8, and their corresponding ejectors 460 and 860, allow the user to spend 80% less force to lift the fan module 300, compared to the prior art fan carrier 50 in FIG. 1. The user can easily and conveniently release the fan module 300, and is less restricted to the limited space on either of the fan carriers 400 and 800, as compared to the prior art fan carrier 50. In addition, the fan module 300 itself can include fewer pieces for the fan holder 310, which may also be integrated as one single piece. The fan holder 310 allows the replacement process to be much easier and more convenient. The material cost for the fan holder 310 is also reduced. Thus, the present disclosure solves the problem described above, by offering convenient fan module replacement and reduced operation cost.

While the example fan carriers 400 and 800 are configured to house one or more fan modules 300, the corresponding ejectors 460 and/or 860 may be built into any component carriers configured to house any removable electronic components for any electronic system. Such electronic systems may include, for example, any type of server, storage devices, network switches, communications equipment, and the like.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A component carrier configured to house an electronic component, the component carrier comprising:
    a baseboard configured to interface the electronic component;
    two sidewalls extending from opposite sides of the baseboard, the baseboard and the two sidewalls forming a slot for receiving the electronic component; and
    an ejector including:
        a side plate positioned in proximity to a first sidewall of the two sidewalls;
        a handle extending from a first end of the side plate of the ejector in a first direction that is generally perpendicular to the side plate; and
        a tab positioned in proximity to the baseboard and extending from a second end of the side plate opposite to the first end, the tab extending in a second direction that is (i) generally perpendicular to the side plate and (ii) opposite to the first direction, the tab coupled to a first connector extending from the baseboard,
    wherein the baseboard includes a first opening such that a portion of the tab of the ejector is configured to directly contact the electronic component through the first opening.

2. The component carrier of claim 1, wherein the tab of the ejector includes a raised protrusion that is configured to directly contact the electronic component.

3. The component carrier of claim 2, wherein the raised protrusion is configured to directly contact the electronic component at a location adjacent to an external connector of the electronic component.

4. The component carrier of claim 1, wherein the tab is pivotably coupled to the first connector extending from the baseboard adjacent to the first sidewall of the component carrier.

5. The component carrier of claim 4, wherein the side plate of the ejector is integrated with the handle and the tab of the ejector, such that pulling the handle away from the first sidewall of the component carrier causes the tab to advance inside the slot through the first opening of the baseboard.

6. The component carrier of claim 4, wherein the side plate of the ejector is integrated with the handle and rotatably coupled to the tab of the ejector, such that pushing the handle towards the baseboard of the component carrier causes the tab to advance inside the slot through the first opening of the baseboard.

7. The component carrier of claim 1, wherein the electronic component is a fan module.

8. The component carrier of claim 7, wherein each of the two sidewalls of the component carrier includes a generally circular opening in a path of airflow generated by the fan module.

9. The component carrier of claim 7, wherein the fan module includes a fan and a fan holder.

10. The component carrier of claim 9, wherein the fan holder includes two opposing fan guards, and wherein the fan holder is configured to receive the fan such that the two opposing fan guards are disposed on two opposing sides of the fan and in a path of airflow generated by the fan.

11. The component carrier of claim 10, wherein the side plate of the ejector includes a generally circular opening in the path of airflow generated by the fan.

12. The component carrier of claim 10, wherein the fan holder further includes a bottom plate integrated with the two opposing fan guards.

13. A component carrier comprising:
a baseboard configured to interface a component module;
a first sidewall and a second sidewall extending from opposite sides of the baseboard, the baseboard, the first sidewall, and the second sidewall forming a slot for receiving the component module; and
an ejector including:
  a generally rectangular side plate;
  a handle extending from a first end of the side plate of the ejector in a first direction that is generally perpendicular to the side plate; and
  a tab positioned in proximity to the baseboard and extending from a second end of the side plate opposite to the first end, the tab extending in a second direction that is (i) generally perpendicular to the side plate and (ii) opposite to the first direction, the tab coupled to a first connector extending from the baseboard,
wherein the component module includes an external connector for coupling the component module to an electronic component outside the component carrier,
wherein the component carrier is configured to receive the component module such that the external connector of the component module is closer to the first sidewall than the second sidewall, and
wherein the baseboard includes an opening such that a portion of the tab of the ejector is configured to directly contact the component module through the opening.

14. The component carrier of claim 13, wherein the side plate of the ejector is positioned in proximity to the first sidewall, and wherein the tab is pivotably coupled to the first connector extending from the baseboard adjacent to the first sidewall of the component carrier.

15. The component carrier of claim 14, wherein the side plate of the ejector is integrated with the handle and the tab of the ejector, such that pulling the handle away from the first sidewall causes the tab to advance inside the slot through the opening of the baseboard.

16. The component carrier of claim 13, wherein the side plate of the ejector is positioned in proximity to the second sidewall, and wherein the tab is pivotably coupled to the first connector extending from the baseboard adjacent to the second sidewall of the component carrier.

17. The component carrier of claim 16, wherein the side plate of the ejector is integrated with the handle and rotatably coupled to the tab of the ejector, such that pushing the handle towards the baseboard of the component carrier causes the tab to advance inside the slot through the opening of the baseboard.

18. The component carrier of claim 16, wherein the side plate of the ejector is integrated with the handle and the tab of the ejector, such that pulling the handle away from the second sidewall causes the tab to advance inside the slot through the opening of the baseboard.

19. An ejector for coupling to a component carrier, the ejector comprising:
a generally rectangular side plate positioned in proximity to a first sidewall of two sidewalls of the component carrier, the component carrier including a baseboard configured to interface an electronic component, the two sidewalls of the component carrier extending from opposite sides of the baseboard such that the baseboard and the two sidewalls form a slot for receiving the electronic component;
a handle extending from a first end of the side plate of the ejector in a first direction that is generally perpendicular to the side plate; and
a tab positioned in proximity to the baseboard and extending from a second end of the side plate opposite to the first end, the tab extending in a second direction that is (i) generally perpendicular to the side plate and (ii) opposite to the first direction, the tab coupled to a first connector extending from the baseboard of the component carrier, wherein the baseboard of the component carrier includes an opening such that a portion of the tab of the ejector is configured to directly contact the electronic component through the opening.

20. The ejector of claim 19, wherein the tab is pivotably coupled to the first connector extending from the baseboard adjacent to the first sidewall of the component carrier, such that actuation of the handle causes the tab to advance inside the slot through the opening of the baseboard of the component carrier.

* * * * *